US008965723B2

(12) United States Patent
Jo et al.

(10) Patent No.: US 8,965,723 B2
(45) Date of Patent: Feb. 24, 2015

(54) APPARATUS AND METHOD FOR ESTIMATING STATE OF CHARGE OF BATTERY

(71) Applicant: LG Chem, Ltd., Seoul (KR)

(72) Inventors: Youngchang Jo, Daejeon (KR); Kiwook Jang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/359,610

(22) PCT Filed: Oct. 24, 2013

(86) PCT No.: PCT/KR2013/009535
§ 371 (c)(1),
(2) Date: May 21, 2014

(87) PCT Pub. No.: WO2014/065615
PCT Pub. Date: May 1, 2014

(65) Prior Publication Data
US 2014/0303915 A1  Oct. 9, 2014

(30) Foreign Application Priority Data

Oct. 26, 2012  (KR) .................. 10-2012-0119712

(51) Int. Cl.
*G01R 31/36* (2006.01)
*H02J 7/00* (2006.01)

(52) U.S. Cl.
CPC .......... *G01R 31/3648* (2013.01); *G01R 31/362* (2013.01); *H02J 7/0052* (2013.01); *G01R 31/361* (2013.01); *G01R 31/3679* (2013.01); *G01R 31/3606* (2013.01); *G01R 31/3651* (2013.01)
USPC .............................. 702/63; 320/151; 320/162

(58) Field of Classification Search
CPC ... H02J 7/0052; G01R 31/362; G01R 31/361; G01R 31/3679; G01R 31/3651
USPC ..................................... 702/63; 320/152, 162
See application file for complete search history.

(56) References Cited

U.S. PATENT DOCUMENTS 7,197,487 B2 *  3/2007  Hansen et al. .................. 706/25
7,583,059 B2 *  9/2009  Cho ............................. 320/132

(Continued)

FOREIGN PATENT DOCUMENTS

JP  2007-212298 A  8/2007
JP  2008-533486 A  8/2008

(Continued)

OTHER PUBLICATIONS

International Search Report, issued in PCT/KR2013/009535, dated Feb. 18, 2014.

(Continued)

*Primary Examiner* — Carol S Tsai
(74) *Attorney, Agent, or Firm* — Birch, Stewart, Kolasch & Birch, LLP

(57) ABSTRACT

Provided are battery SOC estimating apparatus and method. The battery SOC estimating apparatus according to the present invention includes a first SOC calculating unit which applies a predetermined parameter to calculate a first state of charge (SOC) of a battery; one or more second SOC calculating units which individually apply different parameters to calculate one or more second SOCs of the battery; and an optimal parameter extracting unit which confirms a second SOC which is the closest to an actual SOC of the battery from one or more second SOCs to extract a parameter which is applied to the second SOC which is the closest to the actual SOC as an optimal parameter, in which the first SOC calculating unit applies the optimal parameter to calculate a final SOC of the battery.

14 Claims, 3 Drawing Sheets

(56) References Cited

U.S. PATENT DOCUMENTS

| | | | |
|---|---|---|---|
| 7,994,755 B2 * | 8/2011 | Plett | 320/132 |
| 8,332,169 B2 * | 12/2012 | Kang et al. | 702/63 |
| 8,498,766 B2 * | 7/2013 | Takahashi et al. | 701/22 |
| 8,519,675 B2 * | 8/2013 | Plett | 320/132 |
| 8,615,372 B2 * | 12/2013 | Tomura et al. | 702/63 |
| 2006/0212277 A1 * | 9/2006 | Hansen et al. | 703/2 |
| 2006/0244458 A1 | 11/2006 | Cho et al. | |
| 2007/0188143 A1 | 8/2007 | Plett | |
| 2009/0024338 A1 | 1/2009 | Suzuki | |
| 2010/0023285 A1 * | 1/2010 | Nakanishi | 702/63 |
| 2010/0174499 A1 * | 7/2010 | Kang et al. | 702/63 |
| 2011/0161025 A1 * | 6/2011 | Tomura et al. | 702/63 |
| 2012/0086405 A1 | 4/2012 | Shigemizu et al. | |
| 2012/0112754 A1 * | 5/2012 | Kawai | 324/428 |
| 2012/0191390 A1 | 7/2012 | Kang et al. | |
| 2012/0290235 A1 * | 11/2012 | Schaefer et al. | 702/63 |
| 2012/0310563 A1 * | 12/2012 | Shigemizu et al. | 702/63 |
| 2013/0013236 A1 * | 1/2013 | Takahashi | 702/63 |
| 2013/0110429 A1 * | 5/2013 | Mitsuyama et al. | 702/63 |
| 2013/0154577 A1 * | 6/2013 | Iwane et al. | 320/162 |
| 2013/0297243 A1 * | 11/2013 | Baba et al. | 702/63 |
| 2014/0009123 A1 * | 1/2014 | Park et al. | 320/152 |

FOREIGN PATENT DOCUMENTS

| | | |
|---|---|---|
| JP | 2009-526220 A | 7/2009 |
| KR | 10-2006-0100647 A | 9/2006 |
| KR | 10-2009-0020470 A | 2/2009 |
| KR | 10-2012-0024777 A | 3/2012 |

OTHER PUBLICATIONS

Written Opinion of the International Searching Authority, issued in PCT/KR2013/009535, dated Feb. 18, 2014 with translation.

* cited by examiner

APPARATUS AND METHOD FOR ESTIMATING STATE OF CHARGE OF BATTERY

CROSS-REFERENCE TO RELATED APPLICATIONS

This application claims priority to and the benefit of Korean Patent Application No. 10-2012-0119712 filed in the Korean Intellectual Property Office on Oct. 26, 2012, the entire contents of which are incorporated herein by reference.

TECHNICAL FIELD

The present invention relates to an apparatus and a method for estimating a state of charge of a battery, and more particularly, to an apparatus for estimating a state of charge of a battery which includes a first SOC calculating unit which applies a predetermined parameter to calculate a first state of charge (SOC) of a battery and one or more second SOC calculating units which individually apply different parameters to calculate one or more second SOCs of the battery to extract a parameter which is applied to the second SOC which is close to an actual SOC of the battery as an optimal parameter and apply the optimal parameter to calculate a final SOC of the battery so that a parameter which is used to estimate the SOC is corrected in real time and high accuracy of the SOC is maintained regardless of a storage status and degradation of the battery and a method for estimating a state of charge of a battery.

BACKGROUND ART

A secondary battery which has a high applicability to a product group and an electrical property such as a high energy density is widely applied not only to portable equipment, but also an electric vehicle (EV) or a hybrid vehicle (HV) which is driven by an electrical driving source or an energy storage system (ESS) or an uninterruptible power supply (UPS) system which uses a medium or large size battery used for domestic or industrial purpose.

Such a secondary battery has a primary advantage which drastically reduces the usage of a fossil fuel but does not create by-products in accordance with the usage of the energy, so that the secondary battery has drawn attention as a new energy source which is environmentally friendly and improves energy efficiency.

When the secondary battery is embodied as a battery for a portable terminal, suitability of the secondary battery for a high capacity environment is not necessarily increased. However, the battery which is applied to the electric vehicle or an energy storage source is generally used such that a plurality of unit secondary battery cells are grouped together to increase suitability for a high capacity environment.

When such a battery, specifically, a plurality of secondary batteries is alternately charged and discharged, it is required to manage the battery such that the charging and the discharging of the batteries are efficiently controlled to maintain appropriate operation status and performance.

To this end, a battery management system (BMS) which manages the status and the performance of the battery is provided. The BMS measures a current, a voltage, or a temperature of the battery to estimate a state of charge (SOC) of the battery based on the measured current, voltage, and temperature and controls the SOC so that the fuel consumption efficiency is the best. In order to correctly control the SOC, it is required to correctly measure the SOC of the battery which is being charged and discharged.

A method which measures an SOC of the battery in the BMS of the related art includes a method which accumulates a charged/discharged current which flows in the battery to estimate an SOC of the battery. However, according to this method, an error which is generated when a current is measured by a current sensor is continuously accumulated so that accuracy of the SOC is lowered as time goes by.

Alternatively, there is a method which measures a voltage of a battery while charging/discharging the battery, estimates an open circuit voltage (OCV) of the battery in a non-loaded status from the measured voltage and maps the SOC corresponding to the estimated open circuit voltage referring to an SOC table for every open circuit voltage. However, the voltage which is measured while charging or discharging the battery is largely different from an actual voltage. For example, when the battery is connected to a load to start discharging the battery, the voltage of the battery is suddenly lowered and when the charging of the battery is started from an external power source, the voltage of the battery is suddenly increased. Accordingly, accuracy of the SOC may be lowered due to an error between the voltage measured at the time of charging/discharging the battery and the actual voltage.

Alternatively, a method which considers the battery as an electrical model and compares a theoretical output value of the battery model with an actual output value to estimate the SOC through active correction includes an SOC estimating method which is called an extended Kalman filter (EKF) SOC estimation algorithm. According to the EKF SOC estimation algorithm, a maximum error of the SOC is low, for example, 3% at a room temperature and the SOC estimation may be stably performed significantly regardless of the power pattern so that the EKF SOC estimation algorithm is widely used to estimate the SOC of the battery.

The EKF SOC estimation algorithm extracts a parameter of the battery model through an experiment and makes the extracted parameter as a table. However, the parameter which has been extracted and calculated is not changed so that the accuracy of the SOC is high at an initial stage but the accuracy of the SOC may be lowered in accordance with actual storage status and the degradation of the battery.

SUMMARY OF THE INVENTION

The present invention has been made in an effort to provide an apparatus for estimating a state of charge of a battery which includes a first SOC calculating unit which applies a predetermined parameter to calculate a first state of charge (SOC) of a battery and one or more second SOC calculating units which individually apply different parameters to calculate one or more second SOCs of the battery to extract a parameter which is applied to the second SOC which is close to an actual SOC of the battery as an optimal parameter and apply the optimal parameter to calculate a final SOC of the battery so that a parameter which is used to estimate the SOC is corrected in real time and high accuracy of the SOC is maintained regardless of a storage status and degradation of the battery and a method for estimating a state of charge of a battery.

An exemplary embodiment of the present invention provides a battery SOC estimating apparatus including: a first SOC calculating unit which applies a predetermined parameter to calculate a first state of charge (SOC) of a battery; one or more second SOC calculating units which individually apply different parameters to calculate one or more second SOCs of the battery; and an optimal parameter extracting unit which confirms a second SOC which is the closest to an actual SOC of the battery from one or more second SOCs to extract a parameter which is applied to the second SOC which is the closest to the actual SOC as an optimal parameter, in which first SOC calculating unit may apply the optimal parameter to calculate a final SOC of the battery.

The predetermined parameter may be a parameter which is extracted from a battery model of an extended Kalman filter (EKF) SOC estimation algorithm.

The second SOC calculating unit may calculate one or more second SOCs simultaneously when the first SOC calculating unit calculates the first SOC.

The optimal parameter extracting unit may extract the optimal parameter in real time using the second SOCs which are simultaneously calculated in the second SOC calculating units.

When a current which flows in the battery flows to be a predetermined current value or lower for a predetermined time or longer, the optimal parameter extracting unit may determine a voltage value at that time as an open circuit voltage (OCV) of the battery and calculate the actual SOC of the battery using the OCV.

The predetermined time may be 30 minutes.

The predetermined current value may be 1 A.

The parameter may be a value related with one or more of a current, a voltage, and a temperature of the battery.

An exemplary embodiment of the present invention provides a battery SOC estimating method including: calculating a first state of charge (SOC) of a battery by applying a predetermined parameter; calculating one or more second SOCs of the battery by individually applying different parameters; confirming a second SOC which is the closest to an actual SOC of the battery from the one or more second SOCs; extracting a parameter which is applied to the second SOC which is the closest to the actual SOC as an optimal parameter; and calculating a final SOC of the battery by applying the optimal parameter.

The predetermined parameter may be a parameter which is extracted from a battery model of an extended Kalman filter (EKF) SOC estimation algorithm.

The calculating of a second SOC may be performed simultaneously with the calculating of a first SOC.

The extracting of a parameter which is applied to the second SOC which is the closest to the actual SOC as an optimal parameter may include extracting the optimal parameter in real time using the second SOCs which are simultaneously calculated in the calculating of a second SOC.

The battery SOC estimating method may further include determining a voltage value at that time as an open circuit voltage (OCV) of the battery when a current which flows in the battery flows to be a predetermined current value or lower for a predetermined time or longer; and calculating an actual SOC of the battery using the OCV.

The predetermined time may be 30 minutes.

The predetermined current value may be 1 A.

The parameter may be a value related with one or more of a current, a voltage, and a temperature of the battery.

According to an aspect of the present invention, it is possible to provide an apparatus for estimating a state of charge of a battery which includes a first SOC calculating unit which applies a predetermined parameter to calculate a first state of charge (SOC) of a battery and one or more second SOC calculating units which individually apply different parameters to calculate one or more second SOCs of the battery to extract a parameter which is applied to the second SOC which is close to an actual SOC of the battery as an optimal parameter and apply the optimal parameter to calculate a final SOC of the battery so that a parameter which is used to estimate the SOC is corrected in real time and high accuracy of the SOC is maintained regardless of a storage status and degradation of the battery and a method for estimating a state of charge of a battery.

DETAILED DESCRIPTION

The present invention will be described in detail below with reference to the accompanying drawings. Herein, repeated description and the detailed description of a known function and configuration that may make the purpose of the present invention unnecessarily ambiguous will be omitted. Exemplary embodiments of the present invention are provided so that those skilled in the art may more completely understand the present invention. Accordingly, the shape, the size, etc., of elements in the figures may be exaggerated for explicit comprehension.

In the specification, unless explicitly described to the contrary, the word "comprise" and variations such as "comprises" or "comprising", will be understood to imply the inclusion of stated elements but not the exclusion of any other elements.

The term "-unit" described in the specification means a unit for processing at least one function and operation and can be implemented by hardware components or software components or combinations thereof.

Figure 1:
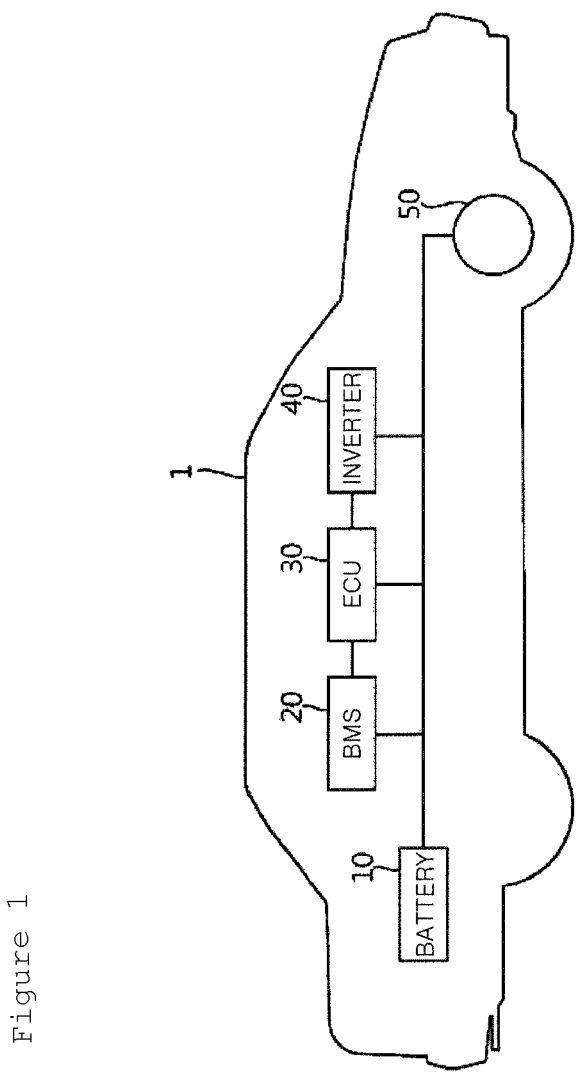
FIG. 1 is a diagram schematically illustrating an electric vehicle to which a battery SOC estimating apparatus according to an exemplary embodiment of the present invention is applied.

FIG. 1 is a diagram schematically illustrating an electric vehicle to which a battery SOC estimating apparatus according to an exemplary embodiment of the present invention is applied.

FIG. 1 illustrates an example in which a battery SOC estimating apparatus according to an exemplary embodiment of the present invention is applied to an electric vehicle. However, the battery SOC estimating apparatus according to an exemplary embodiment of the present invention may be applied to any technical fields such as a domestic or industrial energy storage system (ESS) or an uninterruptible power supply (UPS) system, if a secondary battery is applied thereto, other than the electric vehicle.

The electric vehicle 1 may include a battery 10, a battery management system (BMS) 20, an electronic control unit (ECU) 30, an inverter 40, and a motor 50.

The battery 10 is an electric energy source which supplies a driving force to the motor 50 to drive the electric vehicle 1. The battery 10 may be charged or discharged by the inverter 40 in accordance with the driving of the motor 50 and/or an internal combustion engine (not illustrated).

Here, a type of battery 10 is not specifically limited, and for example, the battery 10 may be configured by a lithium ion battery, a lithium polymer battery, a nickel cadmium battery, a nickel hydrogen battery, or a nickel zinc battery.

The battery 10 is formed of a battery pack in which a plurality of battery cells are connected in series and/or parallel. One or more battery packs are provided to form the battery 10.

The BMS 20 estimates a state of the battery 10 and manages the battery 10 using estimated state information. For example, the BMS 20 estimates and manages state information of the battery 10 such as a state of charge (SOC), a state of health (SOH), a maximum input/output power capability, or an output voltage of the battery 10. The BMS 20 controls charging or discharging of the battery 10 using the state information and may also estimate a time to replace the battery 10.

The BMS 20 according to the present invention may include a battery SOC estimating apparatus (100 of FIG. 2) which will be described below. Accuracy and reliability of estimating the SOC of the battery 10 may be improved using the battery SOC estimating apparatus.

The ECU 30 is an electronic control device which controls a status of the electric vehicle 1. For example, the ECU 30 determines a degree of torque based on information such as an accelerator, a break, or a speed and controls an output of the motor 50 so as to comply with torque information.

The ECU 30 sends a control signal to the inverter 40 so that the battery 10 is charged or discharged based on the state information such as SOC or SOH of the battery 10 which is transmitted from the BMS 20.

The inverter 40 charges and discharges the battery 10 based on the control signal of the ECU 30.

The motor 50 drives the electric vehicle 1 using an electric energy of the battery 10, based on the control information (for example, torque information) which is transmitted from the ECU 30.

The electric vehicle 1 is driven using the electric energy of the battery 10 so that it is important to accurately estimate the state (for example, the SOC) of the battery 10.

Accordingly, battery SOC estimating apparatus and method according to an exemplary embodiment of the present invention will be described below with reference to FIGS. 2 and 3.

Figure 2:
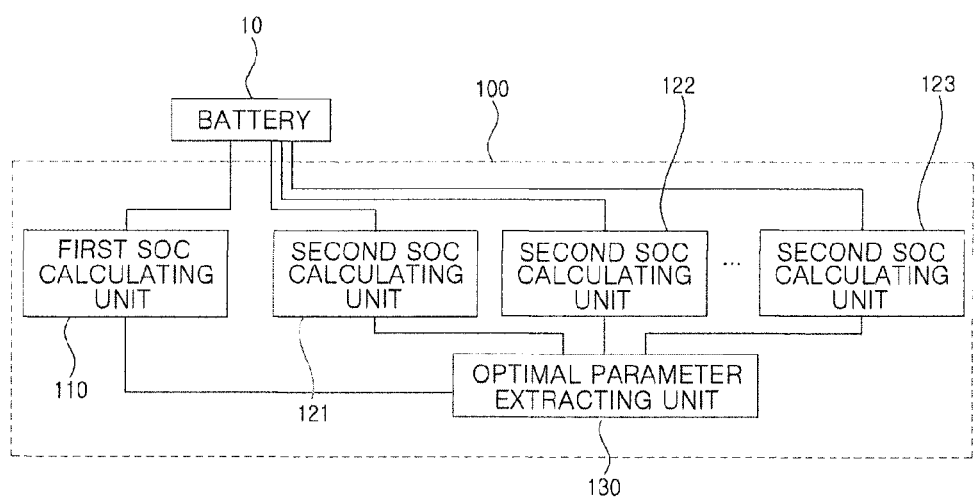
FIG. 2 is a diagram schematically illustrating a battery SOC estimating apparatus according to an exemplary embodiment of the present invention.

FIG. 2 is a diagram schematically illustrating a battery SOC estimating apparatus according to an exemplary embodiment of the present invention.

FIG. 2 is a diagram schematically illustrating a battery SOC estimating apparatus according to an exemplary embodiment of the present invention.

Referring to FIG. 2, a battery SOC estimating apparatus 100 according to an exemplary embodiment of the present invention is connected to a battery 10 to estimate an SOC of the battery 10. The battery SOC estimating apparatus 100 according to the exemplary embodiment of the present invention may be included in at least one of a battery management system (BMS), a power monitoring system (for example, a remote supervisory control and data acquisition (SCADA) system), a user terminal, and a charger/discharger which are connected to the battery 10, or may be embodied as a BMS, a power monitoring system, a user terminal, and a charger/discharger.

The battery SOC estimating apparatus 100 according to the exemplary embodiment of the present invention may include a first SOC calculating unit 110, second SOC calculating units 121, 122, and 123, and an optimal parameter extracting unit 130. The battery SOC estimating apparatus 100 illustrated in FIG. 2 is an exemplary embodiment but constituent elements thereof are not limited to the exemplary embodiment illustrated in FIG. 2 and some constituent elements may be added, modified, or deleted if necessary.

The first SOC calculating unit 110 applies a predetermined parameter to calculate a first SOC of the battery 10. In this case, the parameter is a parameter which is used to estimate the SOC and may be a value related with one or more of a current, a voltage, and a temperature of the battery 10. The predetermined parameter which is used to calculate the first SOC in the first SOC calculating unit 110 may be a parameter which is extracted in a battery model of an extended Kalman filter (EKF) SOC estimation algorithm. The battery model may be extracted in the EKF SOC estimation algorithm through an experiment for the battery and the parameters are determined so as to estimate the most accurate SOC. However, when the SOC is estimated using the parameters which are determined by the experiment, the accuracy of the estimated SOC is high at an initial stage but the accuracy may be lowered later in accordance with the storage status and a degradation degree of the battery. Therefore, the battery SOC estimating apparatus according to the exemplary embodiment of the present invention includes the second SOC calculating units 121, 122, and 123 and the optimal parameter extracting unit 130 to correct the parameter in accordance with the state of the battery 10.

The second SOC calculating units 121, 122, and 123 individually apply different parameters, to calculate one or more second SOCs of the battery 10. In FIG. 2, three second SOC calculating units 121, 122, and 123 are illustrated, which is an exemplary embodiment and one, two, or four or more second SOC calculating units 121, 122, and 123 may be provided if necessary. The second SOC calculating units 121, 122, and 123 individually apply various parameters which are different from the predetermined parameter which is applied in the first SOC calculating unit 110, to calculate a plurality of second SOCs.

The optimal parameter extracting unit 130 confirms a second SOC which is the closest to an actual SOC of the battery 10, among one or more second SOCs, to extract the parameter which is applied to the second SOC which is the closest to the actual SOC as an optimal parameter. Here, when a current which flows in the battery 10 flows to be a predetermined current value or lower for a predetermined time or longer, the optimal parameter extracting unit 130 may determine a voltage value at that time as an open circuit voltage (OCV) of the battery and calculate the actual SOC of the battery using the OCV. In the exemplary embodiment, the predetermined time may be 30 minutes and the predetermined current value may be 1 A. That is, when the current which flows in the battery 10 flows to be 1 A or less for 30 minutes or longer, the optimal parameter extracting unit 130 may determine a voltage value at that time as an open circuit voltage (OCV) of the battery. When the optimal parameter extracting unit 130 uses the OCV to calculate the actual SOC, the SOC corresponding to the estimated OCV is mapped referring to the SOC table for every OCV to obtain the actual SOC.

As described above, after extracting the optimal parameter through the second SOC calculating units 121, 122, and 123 and the optimal parameter extracting unit 130, the first SOC calculating unit 110 applies the optimal parameter to calculate a final SOC of the battery 10. By doing this, the battery SOC estimating apparatus 100 according to the exemplary embodiment of the present invention may calculate an accurate SOC using the extracted optimal parameter.

In one exemplary embodiment, when the first SOC calculating unit 110 calculates the first SOC, the second SOC calculating units 121, 122, and 123 may simultaneously calculate one or more second SOCs. The optimal parameter extracting unit 130 may extract the optimal parameter in real time using the second SOCs which are simultaneously calculated in the second SOC calculating units 121, 122, and 123.

By doing this, the battery SOC estimating apparatus 100 according to the exemplary embodiment of the present invention may calculate an accurate SOC in real time.

Figure 3:
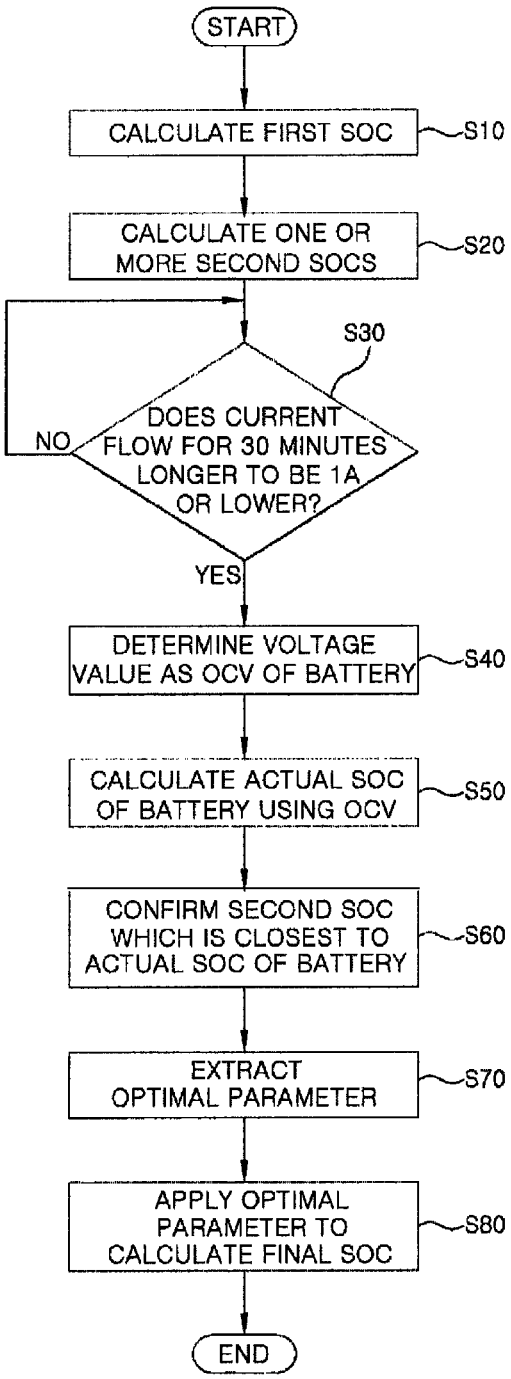
FIG. 3 is a flowchart illustrating a battery SOC estimating method according to an exemplary embodiment of the present invention.

FIG. 3 is a flowchart illustrating a battery SOC estimating method according to an exemplary embodiment of the present invention.

Referring to FIG. 3, when the battery SOC estimating method according to an exemplary embodiment of the present invention starts, first, a predetermined parameter is applied to calculate a first SOC of a battery in S10. In this case, the predetermined parameter may be a parameter which is extracted in a battery model of an EKF SOC estimation algorithm.

Different parameters are applied to calculate one or more second SOCs of the battery in S20.

Next, it is determined whether a current which flows in the battery flows for a predetermined time (for example, 30 minutes) or longer to be a predetermined current value (for example, 1 A) or lower in S30. If the current which flows in the battery flows for the predetermined time or longer to be the predetermined current value or lower, a voltage value at that time is determined as an OCV of the battery in S40 and an actual SOC of the battery is calculated using the OCV in S50.

Next, a second SOC which is the closest to an actual SOC of the battery is confirmed from one or more second SOCs in S60 and the parameter which is applied to the second SOC which is the closest to the actual SOC is extracted as an optimal parameter in S70.

After extracting the optimal parameter in S70, the optimal parameter is applied to calculate a final SOC of the battery in S80.

In one exemplary embodiment, the step S20 may be performed simultaneously with the step S10. In step S70, the second SOC which is simultaneously calculated in the step S20 is used to extract the optimal parameter in real time. By doing this, the battery SOC estimating method according to the exemplary embodiment of the present invention may calculate an accurate SOC in real time.

The above-described battery SOC estimating method has been described with reference to the flowchart illustrated in the drawing. In order to simply describe the present invention, the method has been described as a series of block diagrams but the present invention is not limited to the order of the blocks and processes of some blocks may be performed in a different order from the order of the blocks illustrated and described in the specification or simultaneously performed with other blocks. Various different divergences, flow paths, and orders of the blocks which may achieve the same or similar results may be implemented. All blocks which have been illustrated may not be required to implement the method described in the specification.

While a specific embodiment of the present invention has been illustrated and described, it is obvious to those skilled in the art that the technical spirit of the present invention is not limited to the accompanying drawings and the above description and various modifications may be made without departing from the spirit of the present invention. It is understood that such a modification will be covered by the claims of the present invention within the spirit of the present invention.

What is claimed is:

1. A charging estimating apparatus for calculating a battery state, the apparatus comprising:
   a first SOC calculating unit which applies a predetermined parameter to calculate a first state of charging (SOC) of a battery;
   one or more second SOC calculating units which individually apply different parameters to calculate one or more second SOCs of the battery; and
   an optimal parameter extracting unit which confirms a second SOC which is the closest to an actual SOC of the battery from one or more second SOCs to extract a parameter which is applied to the second SOC which is the closest to the actual SOC as an optimal parameter,
   wherein the first SOC calculating unit applies the optimal parameter to calculate a final SOC of the battery, and
   wherein, when a current which flows in the battery is equal to or lower than a predetermined value for a time that is equal to or longer than a predetermined time, the optimal parameter extracting unit determines a voltage value at the time as an open circuit voltage (OCV) of the battery and calculates the actual SOC of the battery using the OCV.

2. The apparatus of claim 1, wherein the predetermined parameter is a parameter which is extracted from a battery model of an extended Kalman filter (EKF) SOC estimation algorithm.

3. The apparatus of claim 1, wherein the second SOC calculating unit calculates one or more second SOCs simultaneously when the first SOC calculating unit calculates the first SOC.

4. The apparatus of claim 3, wherein the optimal parameter extracting unit extracts the optimal parameter in real time using the second SOCs which are simultaneously calculated in the second SOC calculating units.

5. The apparatus of claim 1, wherein the predetermined time is 30 minutes.

6. The apparatus of claim 1, wherein the predetermined current value is 1 A.

7. The apparatus of claim 1, wherein the parameter is a value related with one or more of a current, a voltage, and a temperature of the battery.

8. A charging estimating method for calculating a battery state, the method comprising:
   calculating a first state of charging (SOC) of a battery by applying a predetermined parameter;
   calculating one or more second SOCs of the battery by individually applying different parameters;
   when a current which flows in the battery is equal to or lower than a predetermined value for a time that is equal to or longer than a predetermined time, determining a voltage value at the time as an open circuit voltage (OCV) of the battery;
   calculating an actual SOC of the battery using the OCV;
   confirming a second SOC which is the closest to the actual SOC of the battery from the one or more second SOCs;
   extracting a parameter which is applied to the second SOC which is the closest to the actual SOC as an optimal parameter; and
   calculating a final SOC of the battery by applying the optimal parameter.

9. The method of claim 8, wherein the predetermined parameter is a parameter which is extracted from a battery model of an extended Kalman filter (EKF) SOC estimation algorithm.

10. The method of claim 9, wherein the calculating of a second SOC is performed simultaneously with the calculating of a first SOC.

11. The method of claim 10, wherein the extracting of a parameter which is applied to the second SOC which is the closest to the actual SOC as an optimal parameter includes extracting the optimal parameter in real time using the second SOCs which are simultaneously calculated in the calculating of a second SOC.

12. The method of claim 8, wherein the predetermined time is 30 minutes.

13. The method of claim 8, wherein the predetermined current value is 1 A.

14. The method of claim 8, wherein the parameter is a value related with one or more of a current, a voltage, and a temperature of the battery.

* * * * *